(12) United States Patent
Chung et al.

(10) Patent No.: US 10,883,667 B2
(45) Date of Patent: Jan. 5, 2021

(54) LED LIGHT SOURCE MODULE AND METHOD FOR MANUFACTURING THE SAME

(71) Applicants: RADIANT OPTO-ELECTRONICS (SUZHOU) CO., LTD, Suzhou (CN); RADIANT OPTO-ELECTRONICS CORPORATION, Kaohsiung (TW)

(72) Inventors: Chih-Hsien Chung, Kaohsiung (TW); Hsiu-Hung Yeh, Kaohsiung (TW); Ching-Yuan Chen, Kaohsiung (TW); Yen-Chuan Chu, Kaohsiung (TW)

(73) Assignees: RADIANT OPTO-ELECTRONICS (SUZHOU) CO., LTD, Jiangsu (CN); RADIANT OPTO-ELECTRONICS CORPORATION, Kaohsiung (TW)

( * ) Notice: Subject to any disclaimer, the term of this patent is extended or adjusted under 35 U.S.C. 154(b) by 25 days.

(21) Appl. No.: 16/145,904

(22) Filed: Sep. 28, 2018

(65) Prior Publication Data
US 2019/0128480 A1 May 2, 2019

Related U.S. Application Data

(63) Continuation of application No. PCT/CN2017/108063, filed on Oct. 27, 2017.

(51) Int. Cl.
*F21K 9/20* (2016.01)
*F21V 8/00* (2006.01)
(Continued)

(52) U.S. Cl.
CPC .................. *F21K 9/20* (2016.08); *F21K 9/61* (2016.08); *F21K 9/90* (2013.01); *F21V 23/06* (2013.01);
(Continued)

(58) Field of Classification Search
CPC combination set(s) only.
See application file for complete search history.

(56) References Cited

U.S. PATENT DOCUMENTS

2017/0005248 A1* 1/2017 Tomohiro ............. H01L 27/156

FOREIGN PATENT DOCUMENTS

CN       101577260 A    11/2009
CN       102779923 A    11/2012
(Continued)

OTHER PUBLICATIONS

Taiwan Patent Office, Office Action, Patent Application Serial No. 106137744, dated Nov. 29, 2018, Taiwan.
(Continued)

*Primary Examiner* — Tucker J Wright

(57) ABSTRACT

An LED light source module is provided, including a substrate, a protective layer, a first conductive terminal, a second conductive terminal, at least one auxiliary structure, and a light-emitting member. The protective layer is disposed on the substrate and has an opening. The first conductive terminal, the second conductive terminal, and the auxiliary structure are disposed on the substrate and accommodated in the opening, wherein the auxiliary structure is disposed between the first conductive terminal and the second conductive terminal. The light-emitting member has a first electrode and a second electrode, respectively electrically connected to the first conductive terminal and the second conductive terminal. The auxiliary structure is disposed between the light-emitting member and the substrate. A method for manufacturing the aforementioned LED light source module is also provided.

20 Claims, 5 Drawing Sheets

(51) Int. Cl.
*F21K 9/61* (2016.01)
*F21K 9/90* (2016.01)
*F21V 23/06* (2006.01)
*H01L 33/44* (2010.01)
*F21Y 115/10* (2016.01)
*H01L 33/62* (2010.01)

(52) U.S. Cl.
CPC ........... *G02B 6/009* (2013.01); *G02B 6/0083* (2013.01); *F21Y 2115/10* (2016.08); *H01L 33/44* (2013.01); *H01L 33/62* (2013.01)

(56) References Cited

FOREIGN PATENT DOCUMENTS

| | | | |
|---|---|---|---|
| CN | 106094377 | A | 11/2016 |
| CN | 106558568 | A | 4/2017 |
| JP | 2009164210 | A | 7/2009 |
| JP | 2016201237 | A | 12/2016 |
| TW | 201313055 | A | 3/2013 |
| TW | 201410083 | A | 3/2014 |

OTHER PUBLICATIONS

China Patent Office, International Search Report, Application Serial No. PCT/CN2017/108063, dated Jul. 12, 2018, China.

* cited by examiner

LED LIGHT SOURCE MODULE AND METHOD FOR MANUFACTURING THE SAME

CROSS REFERENCE TO RELATED APPLICATIONS

The present application is a continuation application of International Application No. PCT/CN2017/108063, filed on Oct. 27, 2017, the disclosure of which is hereby incorporated by reference herein in its entirety.

BACKGROUND OF THE INVENTION

Field of the Invention

The application relates in general to an LED light source module, and in particular, to an LED light source module having an auxiliary structure.

Description of the Related Art

A light-emitting diode (LED) is a luminous semiconductor electronic element. Modern LEDs are available across the visible, ultraviolet, and infrared wavelengths, with very high brightness.

Generally, most LEDs have two electrodes on their bottom surface. When affixing one of the aforementioned LEDs to a printed circuit board (PCB) of a light bar, surface mounting technology (SMT) is mainly used. Openings are formed on a protecting film, and the electrodes can be electrically connected to pads of the printed circuit board through the openings. In detail, solder is firstly printed on the pads of the printed circuit board, and then the LEDs can be placed on the pads having solder. Finally, the LEDs can be affixed to the pads by heating them with a reflow furnace.

However, when the LEDs are inserted into the openings of the protecting film, the LEDs can easily be inclined, and the precision of alignment of the LEDs in the perpendicular direction is influenced. The light may be not be aligned with the receiving surface (such as a light-entering surface of a light guiding plate), or a partial light may be covered by the wall of the openings. Therefore, the utilization efficiency of light is reduced.

BRIEF SUMMARY OF INVENTION

To address the deficiencies of conventional products, an embodiment of the invention provides an LED light source module, including a substrate, a protective layer, a first conductive terminal, a second conductive terminal, at least one auxiliary structure, and a light-emitting member. The protective layer is disposed on the substrate and has an opening. The first conductive terminal, the second conductive terminal, and the auxiliary structure are disposed on the substrate and accommodated in the opening, wherein the auxiliary structure is disposed between the first conductive terminal and the second conductive terminal. The light-emitting member has a first electrode and a second electrode, respectively electrically connected to the first conductive terminal and the second conductive terminal. The auxiliary structure is disposed between the light-emitting member and the substrate.

In some embodiments, the top surface of the auxiliary structure is substantially aligned with the top surface of the protective layer.

In some embodiments, the auxiliary structure comprises a third conductive terminal.

In some embodiments, the auxiliary structure comprises an insulating layer, and the third conductive terminal is disposed between the insulating layer and the substrate.

In some embodiments, the auxiliary structure comprises an insulating layer.

In some embodiments, the light-emitting member has a bottom surface and a plurality of lateral surfaces connected to the bottom surface, wherein the bottom surface is in contact with the auxiliary structure, and the first electrode and the second electrode are disposed on the lateral surfaces.

In some embodiments, the first electrode and the second electrode are disposed on the same lateral surface.

In some embodiments, the first electrode and the second electrode are disposed on different lateral surfaces.

In some embodiments, the LED light source module further comprises a blocking member, disposed on the substrate and accommodated in the opening, and the light-emitting member has a light-emitting surface and a lateral surface opposite to the light-emitting surface, wherein the blocking member is in contact with the lateral surface.

In some embodiments, the LED light source module comprises a plurality of auxiliary structures, and at least one auxiliary structure extends from the blocking member to the protective layer.

In some embodiments, the first conductive terminal, the second conductive terminal, and the auxiliary structure are separated from each other.

An embodiment of the invention further provides a method for manufacturing an LED light source module, including: providing a substrate; forming a first conductive terminal, a second conductive terminal, and at least one wiring layer on the substrate; forming a protective layer, covering the first conductive terminal, the second conductive terminal, and the wiring layer; forming an opening on the protective layer, wherein the first conductive terminal and the second conductive terminal are exposed from the opening; forming at least one auxiliary structure in the opening and between the first conductive terminal and the second conductive terminal; and disposing a light-emitting member on the auxiliary structure. The first electrode and the second electrode of the light-emitting member are respectively electrically connected to the first conductive terminal and the second conductive terminal, and the bottom surface of the light-emitting member is in contact with the auxiliary structure.

In some embodiments, the step of forming the auxiliary structure further comprises forming a third conductive terminal on the substrate, wherein the third conductive terminal is disposed between the first conductive terminal and the second conductive terminal.

In some embodiments, the step of forming the auxiliary structure further comprises disposing an insulating layer on the third conductive terminal.

In some embodiments, the top surface of the auxiliary structure is substantially aligned with the top surface of the protective layer.

In some embodiments, the step of forming the auxiliary structure further comprises forming an insulating layer on the substrate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the LED light source module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
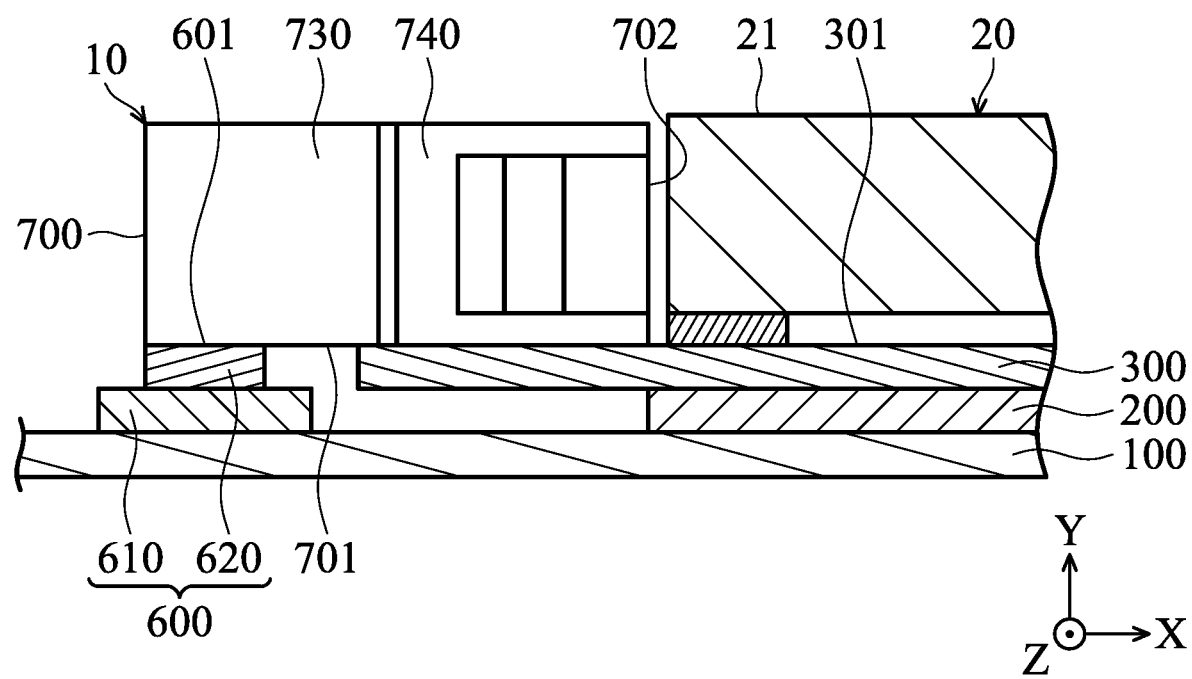
FIG. 1 is a schematic diagram of an LED light source module according to an embodiment of the invention.
Figure 2A:
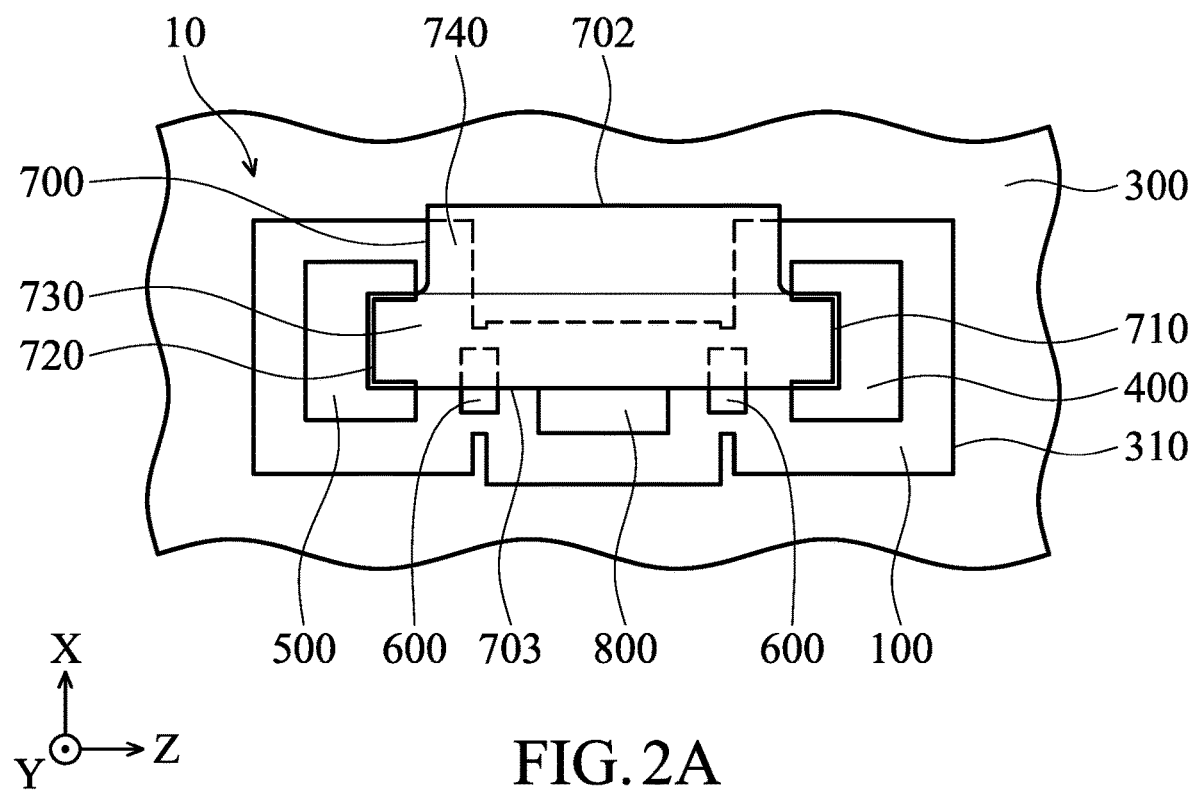
FIG. 2A is a partial top view of an LED light source module according to an embodiment of the invention.

Referring to FIGS. 1 and 2A, in an embodiment of the invention, an LED light source module 10 can be optically coupled to a light guiding member 20 (such as a light guiding plate). The LED source module 10 provides light from the lateral side of the light guiding member 20. After entering the light guiding member 20, the light can be guided thereby and form a surface light on a light-emitting surface 21. The LED light source module 10 primarily comprises a substrate 100, a wiring layer 200, a protective layer 300, a first conductive terminal 400, a second conductive terminal 500, at least one auxiliary structure 600, a light-emitting member 700, and a blocking member 800.

The wiring layer 200 and the protective layer 300 are disposed on the substrate 100, and the wiring layer 200 is disposed between the substrate 100 and the protective layer 300. The first conductive terminal 400, the second conductive terminal 500, and the auxiliary structure 600 are formed by patterned etching the wiring layer 200 on the substrate 100, therefore, the aforementioned members are formed on the same level above the substrate 100. The protective layer 300 is formed on the wiring layer 200, and has an opening 310. The first conductive terminal 400, the second conductive terminal 500, and the auxiliary structure 600 are exposed from the opening 310, and the light-emitting member 700 can be soldered thereon. The purpose of disposing on the substrate 100 and accommodating in the opening 310 can be achieved. It should be noted that, the first conductive terminal 400, the second conductive terminal 500, and the auxiliary structure 600 are separated from each other, and the auxiliary structure 600 is disposed between the first conductive terminal 400 and the second conductive terminal 500 (as shown in FIG. 2A).

As shown in FIGS. 1 and 2A, the light-emitting member 700 is disposed on the auxiliary structure 600, and the auxiliary structure 600 is disposed between the light-emitting member 700 and the substrate 100. Since the top surface 601 of the auxiliary structure 600 is substantially aligned with the top surface 301 of the protective layer 300, the bottom surface 701 of the light-emitting member 700 can contact the aforementioned two top surfaces 601 and 301. Therefore, the light-emitting member 700 can be horizontally disposed relative to the light guiding member 20. In other words, the back region of the light-emitting member 700 is supported by the auxiliary structure 600, and the light-emitting member 700 maintains horizontal in the XY-plane (as shown in FIG. 1). Thus, the light-emitting member 700 with the back region inclined downwardly and the front region inclined upwardly is not easily appeared. The problem of the reduced utilization efficiency of light, which is generated from the light is not aligned with the receiving surface or a partial light is covered by the wall of the openings, can be solved.

In this embodiment, the top surface 601 of the auxiliary structure 600 is substantially aligned with the top surface 301 of the protective layer 300, and the auxiliary structure 600 comprises a third conductive terminal 610 and an insulating layer 620, wherein the third conductive terminal 610 is disposed between the insulating layer 620 and the substrate 100, and the insulating layer 620 is disposed between the light-emitting member 700 and the third conductive terminal 610. The total thickness of the third conductive terminal 610 and the insulating layer 620 is substantially the same as the distance between the top surface 301 of the protective layer 300 and the substrate 100. For example, the thickness of the third conductive terminal 610 can be 10 mm-15 mm, and the thickness of the insulating layer 620 can be 10 mm-15 mm. Therefore, the thickness of the whole auxiliary structure 600 is 20 mm-30 mm.

The third conductive terminal 610, the wiring layer 200, the first conductive terminal 400, and the second conductive terminal 500 can comprise same conductive material, such as copper, aluminum, or an alloy thereof. The insulating layer 620 can comprise suitable insulating material, such as liquid photoimageable solder mask (LPSM). The third conductive terminal 610, the first conductive terminal 400, and the second conductive terminal 500 are formed by pattern etching the wiring layer 200 on the substrate 100, therefore, the aforementioned three members are the same height. Since the auxiliary structure 600 further includes the insulating layer 620 on the third conductive terminal 610, the height of the auxiliary structure 600 is greater than the height of the first conductive terminal 400 and the second conductive terminal 500.

Referring to FIGS. 1 and 2A, the light-emitting member 700 comprises a first electrode 710 and a second electrode 720. In this embodiment, the first electrode 710 and the second electrode 720 are respectively disposed on the opposite lateral surfaces connected to the bottom surface 701. When the light-emitting member 700 is disposed on the auxiliary structure 600 and an SMT process is performed, the heated solder easily congregates in the area having exposed metal due to the characteristic of its surface tension. Thus, the heated solder can fill the spaces between the first electrode 710 and the first conductive terminal 400, and between the second electrode 720 and the second conductive terminal 500, and the first electrode 710 and the second electrode 720 can be respectively electrically connected to the first conductive terminal 400 and the second conductive terminal 500. The required power can be supplied to the light-emitting member 700.

Furthermore, the light-emitting member 700 can be divided into an assembly portion 730 and an excitation portion 740. The first electrode 710 and the second electrode 720 are disposed on the assembly portion 730, and a plurality of phosphor members (such as phosphor powders) are disposed in the excitation portion 740. When the power enters the light-emitting member 700 through the first electrode 710 and the second electrode 720, the phosphor members can be excited and emit light.

It should be noted that, as shown in FIGS. 1 and 2A, a portion of the protective layer 300 is extended to the area between the substrate 100 and the excitation portion 740 of the light-emitting member 700, and the surface of the protective layer 300 has a color with high reflectivity and low absorptance, such as white. Therefore, when the light-emitting member 700 emits light to the light guiding member 20 and the light guiding member 20 generates a surface light, even if a partial light enters light guiding member 20 after reflecting by the protective layer 300, the color difference does not appear on the surface light. In some embodiments, the surface of the protective layer 300 has a color with low reflectivity and high absorptance, such as black. This protective layer 300 is used to the LED light source module 10 having the high brightness light-emitting member 700, so as to absorb the energy of the light-emitting member 700, and the problem of the bright line in the back light module can be avoided.

As shown in FIG. 2A, the blocking member 800 is disposed on the substrate 100 and accommodated in the opening 310. When the light-emitting member 700 is disposed on the auxiliary structure 600, the blocking member 800 is in contact with the lateral surface 703 of the light-emitting member 700 opposite to the light-emitting surface 702. Therefore, if the light guiding member 20 pushes against the light-emitting member 700 along the −X-axis when assembling, the blocking member 800 can provide enough supporting force to prevent the light-emitting member 700 from moving or tilting.

For providing enough supporting force, the blocking member 800 can comprise metal material, such as copper, aluminum, or an alloy thereof, and the substrate and the protective layer 300 can comprise suitable insulating material. For example, the substrate 100 can comprise polyimide (PI).

The structure of the aforementioned LED light source module 10 can ensure that the light-emitting member 700 is horizontally disposed relative to the light guiding member 20, and the light from the light-emitting member 700 is not covered by other members. Thus, the utilization efficiency of light can be enhanced.

Figure 2B:
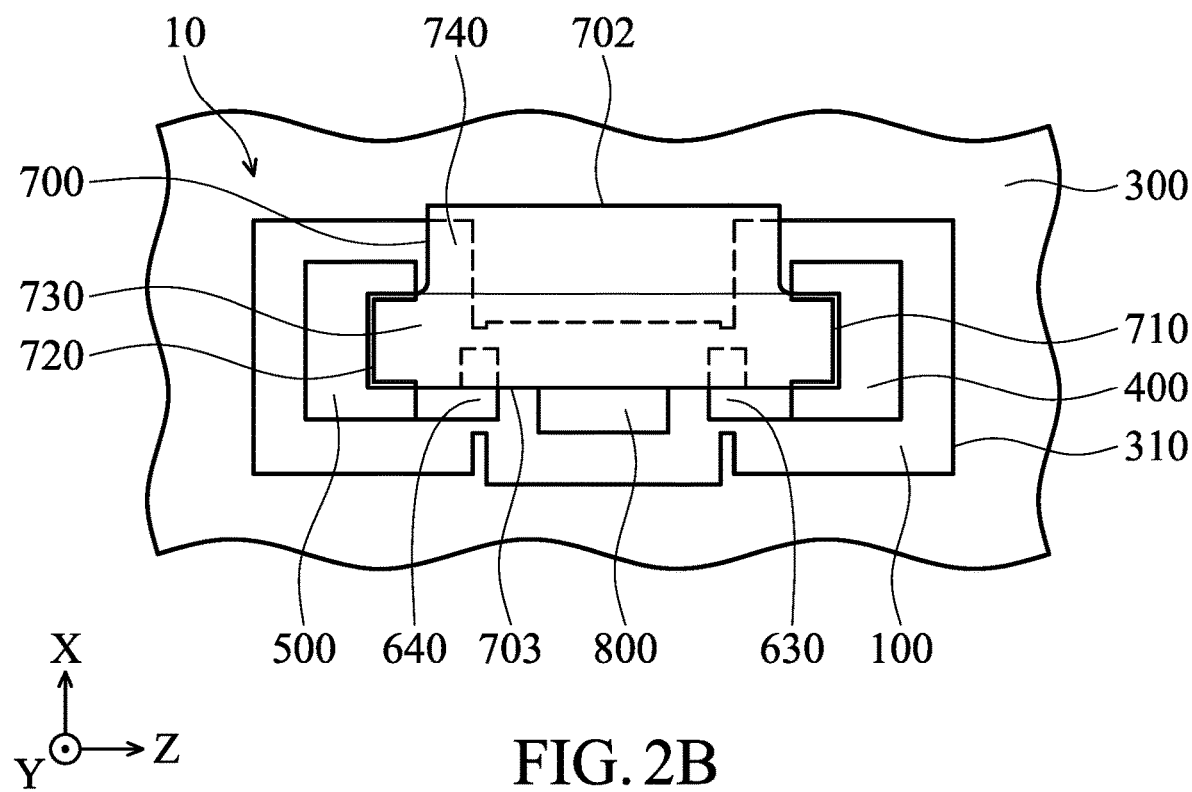
FIG. 2B is a partial top view of an LED light source module according to another embodiment of the invention.

Referring to FIG. 2B, in another embodiment of the invention, the auxiliary structure 600 is constituted by a first extension 630 and a second extension 640. The first extension 630 extends from the first conductive terminal 400 toward the second conductive terminal 500, and enters the area between the light-emitting member 700 and the substrate 100. The second extension 640 extends from the second conductive terminal 500 toward the first conductive terminal 400, and enters the area between the light-emitting member 700 and the substrate 100. The first extension 630 and the first conductive terminal 400 can be integrally formed as one piece, and the second extension 640 and the second conductive terminal 500 can be integrally formed as one piece.

An insulating material can be coated on the surfaces of the first extension 630 and the second extension 640, so as to avoid the short circuit of the first electrode 710 and/or the second electrode 720. For example, the aforementioned insulating material can be liquid photoimageable solder mask. Instead, the first extension 630 and the second extension 640 can respectively extend to the position away from the first electrode 710 and the second electrode 720, and then enter the area between the light-emitting member 700 and the substrate 100.

Figure 3:
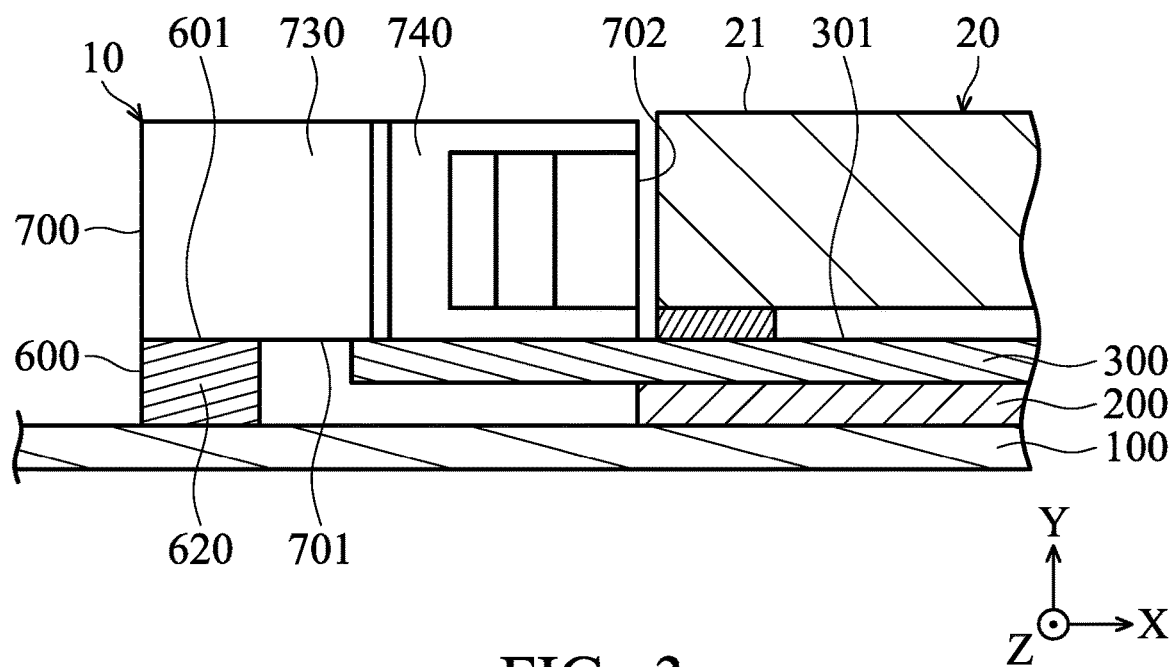
FIG. 3 is a schematic diagram of an LED light source module according to another embodiment of the invention.

Referring to FIG. 3, in another embodiment of the invention, the auxiliary structure 600 of the LED light source module 10 only comprises an insulating layer 620. The insulating layer 620 is in direct contact with the substrate 100 and the bottom surface 701 of the light-emitting member 700, and the thickness of the insulating layer 620 is substantially the same as the distance between the top surface 301 of the protective layer 300 and the substrate 100. Thus, the top surface 601 of the auxiliary structure 600 is substantially aligned with the top surface 301 of the protective layer 300. The insulating layer 620 can comprise liquid photoimageable solder mask, and its thickness can be 10 mm-30 mm (such as 25 mm).

Figure 4:
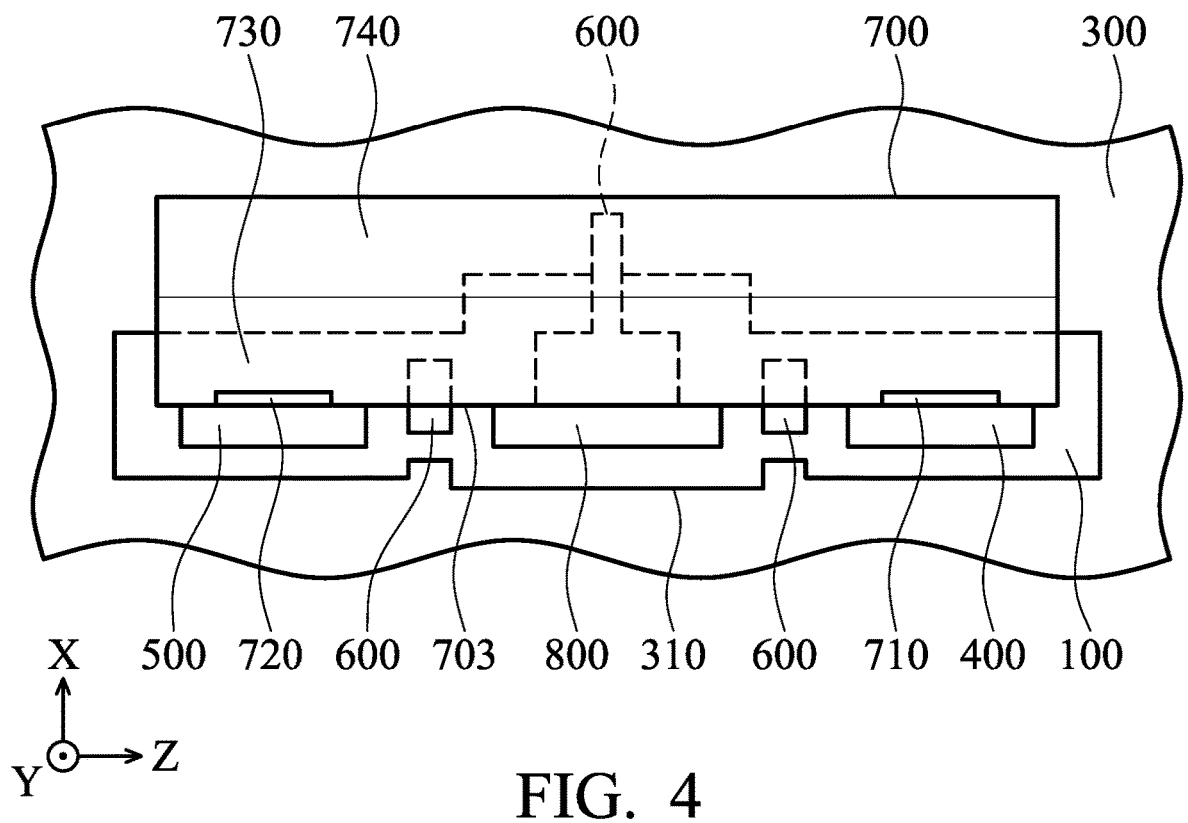
FIG. 4 is a partial top view of an LED light source module according to another embodiment of the invention.

Referring to FIG. 4, in another embodiment of the invention, the LED light source module 10 comprises a plurality of auxiliary structures 600. These auxiliary structures 600 can be constituted by a third conductive terminal 610 and an insulating terminal 620 (the same as the auxiliary structure 600 in FIG. 1), or constituted by a single insulating terminal 620 (the same as the auxiliary structure 600 in FIG. 3). The auxiliary structure 600 in the center can be extended from the blocking member 800 to the protective layer 300, therefore, the light-emitting member 700 can be disposed more steady.

In this embodiment, both the first electrode 710 and the second electrode 720 of the light-emitting member 700 are disposed on the lateral surface 703 opposite to the light-emitting surface 702. Thus, the first conductive terminal 400, the second conductive terminal 500, and the blocking member 800 contact the same surface of the light-emitting member 700 (i.e. lateral surface 703). Moreover, the first electrode 710 and the second electrode 720 can be electrically connected to the first conductive terminal 400 and the second conductive terminal 500. In some embodiments, the first electrode 710 and the second electrode 720 can be disposed on the bottom surface 701 of the light-emitting member 700, or extended from the lateral surface 703 to the bottom surface 701.

Figure 5:
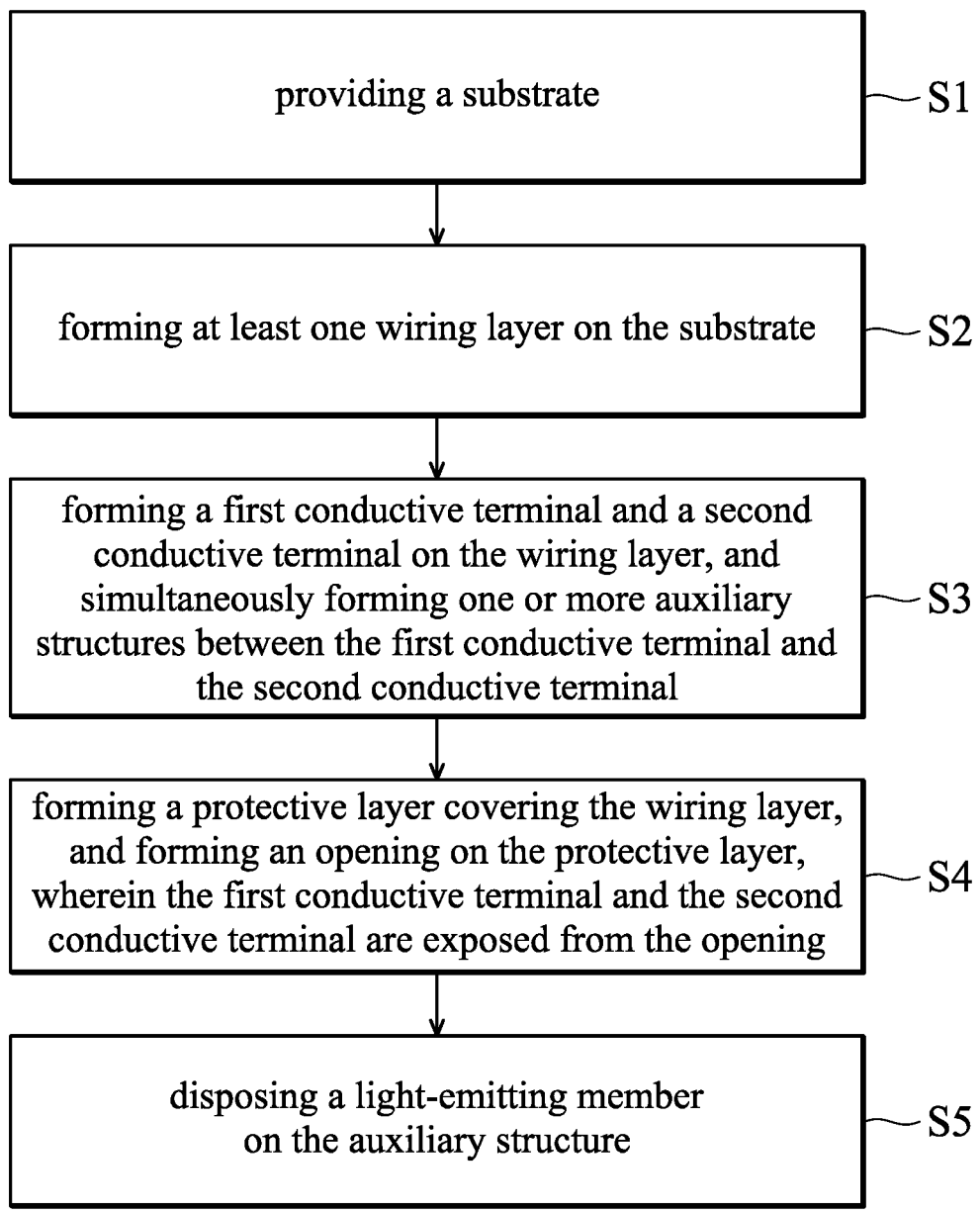
FIG. 5 is a flow chart of a method for manufacturing an LED light source module according to an embodiment of the invention.

Referring to FIGS. 1, 2A, and 5, the method for manufacturing the LED light source module 10 in FIGS. 1 and 2A is discussed below. First, a substrate 100 can be provided (step S1), and at least one wiring layer 200 can be formed on the substrate (step S2).

Second, a first conductive terminal 400 and a second conductive terminal 500 can be formed on the wiring layer 200, and one or more auxiliary structures 600 can be simultaneously formed between the first conductive terminal 400 and the second conductive terminal 500 (step S3). It should be noted that, the step of forming the auxiliary structure 600 comprise forming a third conductive terminal 610 on the wiring layer 200, and disposing an insulating layer 620 on the third conductive terminal 610, wherein the third conductive terminal 610 is disposed between the first conductive terminal 400 and the second conductive terminal 500.

Next, a protective layer 300 covering the wiring layer 200 can be formed, and an opening 310 can be formed on the protective layer 300, wherein the first conductive terminal 400 and the second conductive terminal 500 are exposed from the opening 310 (step S4).

Finally, the light-emitting member 700 can be disposed on the auxiliary structure 600 (step S5), so as to form the LED light source module 10 in FIGS. 1 and 2A. The first electrode 710 and the second electrode 720 of the light-emitting member 700 are respectively electrically connected to the first conductive terminal 400 and the second conductive terminal 500, and the bottom surface 701 of the light-emitting member 700 is in contact with the auxiliary structure 600.

In this embodiment, since the third conductive terminal 610 can be formed by patterned etching the wiring layer 200 on the substrate 100, the step of forming the third conductive terminal 610 and the step of forming the first conductive terminal 400 and the second conductive terminal 500 can be accomplished in the same process, so as to simplify the process and reduce the manufacturing time. After the aforementioned process, the insulating layer 620 can be disposed on the third conductive terminal 610. Furthermore, in some embodiments, the method further comprises the step of forming a blocking member 800 on the substrate 100. Similarly, in some embodiments, the step of forming the blocking member 800 and the step of forming the first conductive terminal 400 and the second conductive terminal 500 can be accomplished in the same process. An insulating material can be further disposed on the portion of the blocking member 800 contacting the light-emitting member 700.

Figure 6:
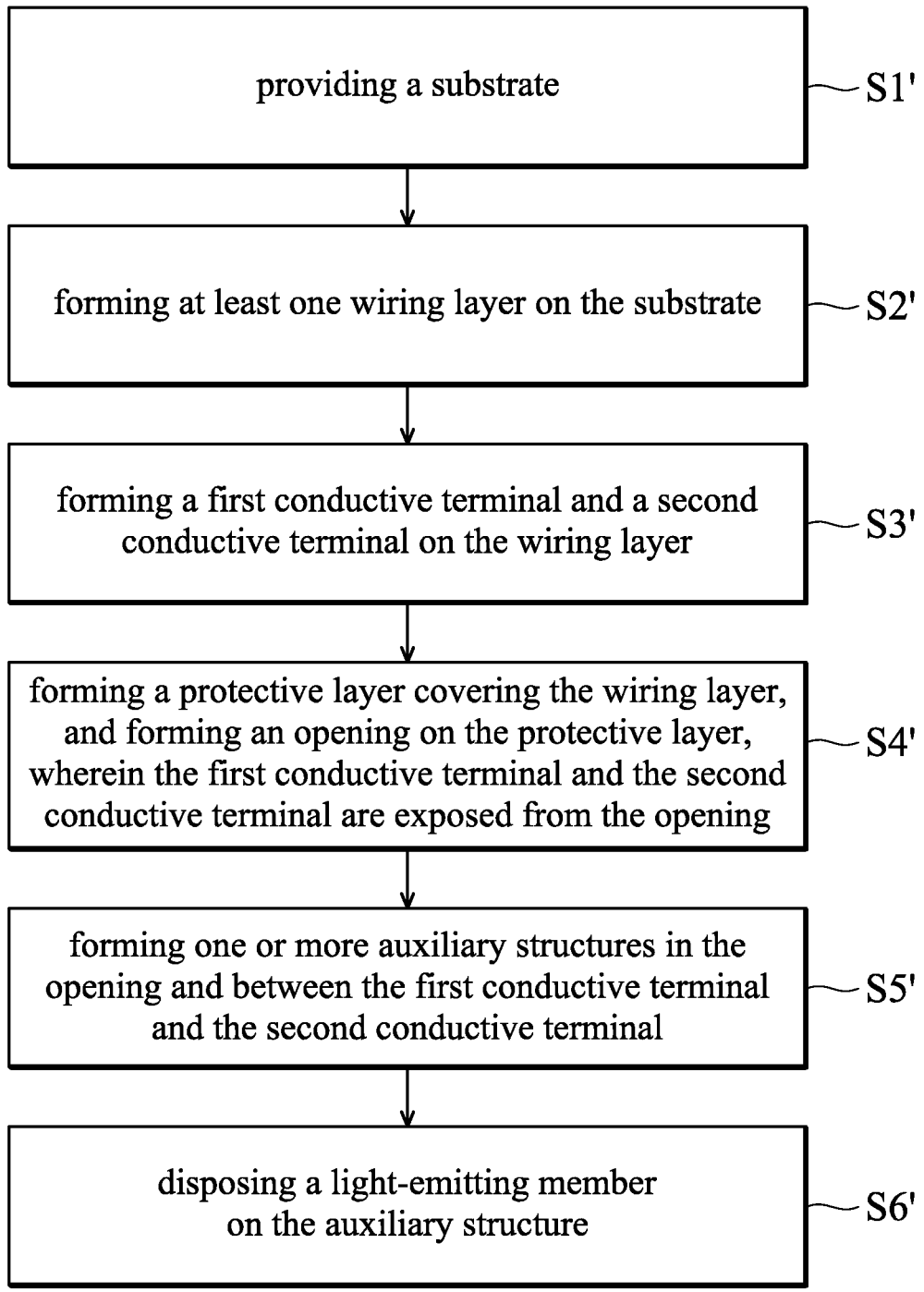
FIG. 6 is a flow chart of a method for manufacturing an LED light source module according to another embodiment of the invention.

Referring to FIGS. 3 and 6, the method for manufacturing the LED light source module 10 in FIG. 3 is discussed below. First, a substrate 100 can be provided (step S1'), and at least one wiring layer 200 can be formed on the substrate (step S2').

Second, a first conductive terminal 400 and a second conductive terminal 500 can be formed on the wiring layer 200 (step S3'). Subsequently, a protective layer 300 covering the wiring layer 200 can be formed, and an opening 310 can be formed on the protective layer 300, wherein the first conductive terminal 400 and the second conductive terminal 500 are exposed from the opening 310 (step S4').

Next, one or more auxiliary structures 600 can be formed in the opening 310 and disposed between the first conductive terminal 400 and the second conductive terminal 500 (S5'). It should be noted that, in this embodiment, the step of forming the auxiliary structure 600 comprises forming an insulating layer 620 on the substrate directly.

Finally, the light-emitting member 700 can be disposed on the auxiliary structure 600 (step S6'), so as to form the LED light source module 10 in FIG. 3. Similarly, the first electrode 710 and the second electrode 720 of the light-emitting member 700 are respectively electrically connected to the first conductive terminal 400 and the second conductive terminal 500, and the bottom surface 701 of the light-emitting member 700 is in contact with the auxiliary structure 600.

In this embodiment, since the auxiliary structure 600 is the insulating layer 620 formed on the substrate 100, it does not need to be formed at the same time that the first conductive terminal 400 and the second conductive terminal 500 are formed by patterned etching the wiring layer 200 on the substrate 100. The insulating layer 620 can be formed after forming the first conductive terminal 400 and the second conductive terminal 500. Moreover, in some embodiments, the blocking member 800 can be made by an insulating material. Therefore, the blocking member 800 does not need to be formed at the same time that the first conductive terminal 400 and the second conductive terminal 500 are formed by patterned etching the wiring layer 200 on the substrate 100, and can be formed after forming the first conductive terminal 400 and the second conductive terminal 500.

In summary, an LED light source module is provided, including an auxiliary structure disposed between the first conductive terminal and the second conductive terminal. The top surface of the auxiliary structure is aligned with the top surface of the protective layer. Therefore, the light-emitting member can be horizontally disposed relative to the light guiding member. The utilization efficiency of light can be enhanced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An LED light source module, comprising:
   a substrate;
   a protective layer, disposed on the substrate and having an opening;
   a first conductive terminal, disposed on the substrate and accommodated in the opening;
   a second conductive terminal, disposed on the substrate and accommodated in the opening;
   at least one auxiliary structure, disposed on the substrate and accommodated in the opening; and
   a light-emitting member, having a first electrode and a second electrode, wherein the first electrode is electrically connected to the first conductive terminal, the second electrode is electrically connected to the second conductive terminal, and the auxiliary structure is disposed between the light-emitting member and the substrate, wherein a back region of the light-emitting member is supported by the auxiliary structure, wherein the light-emitting member has a bottom surface and a plurality of lateral surfaces connected to the bottom surface, wherein the bottom surface is in contact with the auxiliary structure, and the first electrode and the second electrode are disposed on the lateral surfaces and/or the bottom surface.

2. The LED light source module as claimed in claim 1, wherein the top surface of the auxiliary structure is substantially aligned with the top surface of the protective layer.

3. The LED light source module as claimed in claim 1, wherein the auxiliary structure comprises a third conductive terminal.

4. The LED light source module as claimed in claim 3, wherein the auxiliary structure comprises an insulating layer, and the third conductive terminal is disposed between the insulating layer and the substrate.

5. The LED light source module as claimed in claim 1, wherein the auxiliary structure comprises an insulating layer.

6. The LED light source module as claimed in claim 1, wherein the first electrode and the second electrode are disposed on the same lateral surface.

7. The LED light source module as claimed in claim 1, wherein the first electrode and the second electrode are disposed on different lateral surfaces.

8. The LED light source module as claimed in claim 1, wherein the auxiliary structure has a first extension and a second extension, the first extension extends from the first conductive terminal toward the second conductive terminal, and the second extension extends from the second conductive terminal toward the first conductive terminal.

9. An LED light source module, comprising:
a substrate;
a protective layer, disposed on the substrate and having an opening;
a first conductive terminal, disposed on the substrate and accommodated in the opening;
a second conductive terminal, disposed on the substrate and accommodated in the opening;
at least one auxiliary structure, disposed on the substrate and accommodated in the opening; and
a light-emitting member, having a first electrode and a second electrode, wherein the first electrode is electrically connected to the first conductive terminal, the second electrode is electrically connected to the second conductive terminal, and the auxiliary structure is disposed between the light-emitting member and the substrate, wherein a back region of the light-emitting member is supported by the auxiliary structure,
wherein the LED light source module further comprises a blocking member, disposed on the substrate and accommodated in the opening, and the light-emitting member has a light-emitting surface and a lateral surface opposite to the light-emitting surface, wherein the blocking member is in contact with the lateral surface.

10. The LED light source module as claimed in claim 9, wherein the LED light source module comprises a plurality of auxiliary structures, and at least one auxiliary structure extends from the blocking member to the protective layer.

11. A method for manufacturing the LED light source module as claimed in claim 9, comprising:
providing the substrate;
forming at least one wiring layer on the substrate;
forming the first conductive terminal and the second conductive terminal on the at least one wiring layer;
forming the protective layer, covering the wiring layer;
forming an opening on the protective layer, wherein the first conductive terminal and the second conductive terminal are exposed from the opening;
forming the at least one auxiliary structure in the opening; and
disposing the light-emitting member on the auxiliary structure, wherein the bottom surface of the light-emitting member is in contact with the auxiliary structure.

12. An LED light source module, comprising:
a substrate;
a protective layer, disposed on the substrate and having an opening;
a first conductive terminal, disposed on the substrate and accommodated in the opening;
a second conductive terminal, disposed on the substrate and accommodated in the opening;
at least one auxiliary structure, disposed on the substrate and accommodated in the opening; and
a light-emitting member, having a first electrode and a second electrode, wherein the first electrode is electrically connected to the first conductive terminal, the second electrode is electrically connected to the second conductive terminal, and the auxiliary structure is disposed between the light-emitting member and the substrate, wherein a back region of the light-emitting member is supported by the auxiliary structure,
wherein the first conductive terminal, the second conductive terminal, and the auxiliary structure are separated from each other, and the auxiliary structure is disposed between the first conductive terminal and the second conductive terminal.

13. A method for manufacturing the LED light source module as claimed in claim 1, comprising:
providing the substrate;
forming at least one wiring layer on the substrate;
forming the first conductive terminal and the second conductive terminal on the at least one wiring layer;
forming the protective layer, covering the wiring layer;
forming the opening on the protective layer, wherein the first conductive terminal and the second conductive terminal are exposed from the opening;
forming the at least one auxiliary structure in the opening; and
disposing the light-emitting member on the auxiliary structure.

14. The method for manufacturing an LED light source module as claimed in claim 13, wherein the step of forming the auxiliary structure and the step of forming the first conductive terminal and the second conductive terminal are simultaneously performed, and the step of forming the auxiliary structure further comprises forming a third conductive terminal on the wiring layer, wherein the third conductive terminal is disposed between the first conductive terminal and the second conductive terminal.

15. The method for manufacturing an LED light source module as claimed in claim 14, wherein the step of forming the auxiliary structure further comprises disposing an insulating layer on the third conductive terminal.

16. The method for manufacturing an LED light source module as claimed in claim 13, wherein the top surface of the auxiliary structure is substantially aligned with the top surface of the protective layer.

17. The method for manufacturing an LED light source module as claimed in claim 13, wherein the step of forming the auxiliary structure is performed after the step of forming the protective layer, and the step of forming the auxiliary structure further comprises forming an insulating layer on the substrate.

18. The method for manufacturing an LED light source module as claimed in claim 13, wherein the first conductive terminal, the second conductive terminal, and the auxiliary structure are separated from each other, and the auxiliary structure is disposed between the first conductive terminal and the second conductive terminal.

19. The method for manufacturing an LED light source module as claimed in claim 13, wherein the auxiliary structure has a first extension and a second extension, the first extension extends from the first conductive terminal toward the second conductive terminal, and the second extension extends from the second conductive terminal toward the first conductive terminal.

20. A method for manufacturing the LED light source module as claimed in claim 12, comprising:
- providing the substrate;
- forming at least one wiring layer on the substrate;
- forming the first conductive terminal and the second conductive terminal on the at least one wiring layer;
- forming the protective layer, covering the wiring layer;
- forming an opening on the protective layer, wherein the first conductive terminal and the second conductive terminal are exposed from the opening;
- forming the at least one auxiliary structure in the opening; and
- disposing the light-emitting member on the auxiliary structure, wherein the bottom surface of the light-emitting member is in contact with the auxiliary structure.

* * * * *